United States Patent [19]

Porter et al.

[11] Patent Number: 5,024,918

[45] Date of Patent: Jun. 18, 1991

[54] HEAT ACTIVATED DRY DEVELOPMENT OF PHOTORESIST BY MEANS OF ACTIVE OXYGEN ATMOSPHERE

[75] Inventors: Vernon R. Porter, Plano; Thomas C. Penn, Richardson, both of Tex.

[73] Assignee: Texas Instruments Incorporated, Dallas, Tex.

[21] Appl. No.: 754,041

[22] Filed: Dec. 23, 1976

[51] Int. Cl.$^5$ .............................................. G03C 5/24
[52] U.S. Cl. .................................... 430/269; 156/643; 156/644; 430/312; 430/313; 430/314; 430/306; 430/325; 430/326
[58] Field of Search ............... 96/35.1, 36, 36.2, 36.3; 427/39, 41; 156/628, 643, 646

[56] References Cited

U.S. PATENT DOCUMENTS

| | | | |
|---|---|---|---|
| 2,174,629 | 10/1939 | Greiner | 96/35.1 |
| 2,230,981 | 2/1941 | Toland | 96/93 |
| 3,615,476 | 10/1971 | Cassiers | 96/35.1 |
| 3,705,055 | 12/1972 | Christensen et al. | 96/36.3 |
| 3,733,258 | 5/1973 | Hawak et al. | 204/192 |
| 3,837,856 | 9/1974 | Irving et al. | 96/35 |
| 3,920,483 | 11/1975 | Johnson et al. | 204/164 |

OTHER PUBLICATIONS

DeForest, Photoresist Materials an Process, McGraw-Hill, 1975, p. 182.
Holloway et al., Detection by Auger Electron Spectroscopy and Removal by Ozoniation of Photorisist Residues Reliability Physics Symposium, Las Vagas, 12/1974, pp. 180–186.

*Primary Examiner*—David Welsh
*Attorney, Agent, or Firm*—William E. Hiller; N. Rhys Merrett; Melvin Sharp

[57] ABSTRACT

Heat activated method for developing and improving the definition of a patterned heat-photoresist layer as applied to a substrate surface of different material, such as a semiconductor slice, in the fabrication of an electronic structure or photomask, through the use of a reactive species of oxygen including monatomic oxygen or ozone in an oxygen-containing gas. A layer of photoresist material upon being selectively exposed to an energy source, such as ultraviolet radiation, X-ray, or E-beam radiation acquires a predetermined patterned definition therein because of chemical changes in the photoresist material which is photosensitive. After such selective exposure, the photoresist layer is characterized by a differential reactivity which is heightened by a chemical or a physical change occurring in either one of the exposed or unexposed portions of the layer of photoresist material enabling the selective removal thereof. In a preferred embodiment, the photoresist material is of a character undergoing a reduction in thickness in areas unexposed to the energy source which may be accentuated by a further heat treatment to produce regions of reduced thickness in the photoresist layer corresponding to the desired pattern. The regions of photoresist material of reduced thickness are then selectively removed from the layer of photoresist material by the differential reaction of the gaseous reactive oxygen species therewith to develop the pattern in the layer of photoresist material as defined by its selective exposure to the energy source.

30 Claims, 1 Drawing Sheet

HEAT ACTIVATED DRY DEVELOPMENT OF PHOTORESIST BY MEANS OF ACTIVE OXYGEN ATMOSPHERE

BACKGROUND OF THE INVENTION

The present dry development method constitutes an improvement of the dry development method disclosed and claimed in copending U.S. patent application, Ser. No. 752,040 filed Dec. 20, 1976, now abandoned. In the latter connection, dry development processing as contemplated herein and in the aforesaid U.S. application requires a photoresist material which may have a differential etchant rate of reactivity related to its selectively exposed areas and non-exposed areas, when subjected to an oxygen-containing gas in which monatomic oxygen and/or ozone are present as a reactive oxygen species wherein the differential rate of reactivity to an etchant treatment involving the reactive oxygen species is sufficiently large to enable the portion of the layer of photoresist material subject to the greater etchant rate to be completely removed from the underlying substrate surface before any substantial part of the remaining portion of the photoresist material is so removed. A desired pattern as determined by a latent image imparted to the layer of photoresist material through its selective exposure to a suitable energy source, such as ultraviolet radiation, X-ray, or E-beam radiation, is thereby developed in the layer of photoresist material by dry processing as contrasted to the conventional practice of employing liquid chemical solvents as selective etchants.

SUMMARY OF THE INVENTION

This invention is directed to a dry development method for producing a pattern in a layer of photoresist material which has been selectively exposed to an energy source such as ultraviolet, X-ray, or E-beam radiation, wherein development of the selectively exposed photoresist layer is accomplished in a manner constituting an improvement of the method disclosed and claimed in the aforesaid U.S. patent application, Ser. No. 752,040 filed Dec. 20, 1976, now abandoned. To this end, it is contemplated that the photoresist material will be of a character enabling a chemical or physical change to be caused therein after the formation of an image has been imparted thereto by the selective exposure of the layer of photoresist material to a suitable energy source. The chemical or physical change selectively occurs in either of the exposed or unexposed portions of the layer of photoresist material, thereby significantly enhancing selective removal of the photoresist material in developing the pattern provided by the image formed therein, wherein the development occurs by subjecting the selectively exposed layer of photoresist material to an oxygen-containing gaseous atmosphere including an active oxygen species which may be monatomic oxygen and/or ozone for differentially reacting the gaseous reactive oxygen species with the exposed and unexposed regions of the layer of photoresist material. In a preferred form of the method contemplated herein, the chemical or physical change imparted to either one of the exposed or unexposed portions of the photoresist layer induces volatization thereof such that one of the exposed and unexposed portions of the photoresist layer assumes a reduced thickness in contrast to the other of the exposed and unexposed portions. A heat treatment, for example, either accompanying selective exposure of the photoresist layer to a suitable energy source or as a separate stage following such selective exposure may accomplish this reduction in thickness when employed with a suitable photoresist material.

The area of reduced thickness of the layer of photoresist material are subject to a rate of removal by the gaseous active oxygen species greater than the etchant rate to which the remaining regions of the photoresist material are subject, with the reduced thickness imparted thereto enhancing the differential reaction as between the exposed and unexposed regions of the layer of photoresist material, thereby enabling the regions of photoresist material of reduced thickness to be completely removed from the substrate surface to form the desired pattern in the layer of photoresist material from the remaining portions of photoresist material.

More specifically, it is contemplated that the photoresist material employed may be of the type subject to heat-volatilization in its unexposed state such that the application of a heat treatment thereto, after the layer of photoresist material has been selectively exposed to an energy source for imparting an image therein, causes the photoresist material in the unexposed areas to be partially volatized, thereby characterizing the unexposed areas of the layer of photoresist material as having a thickness of reduced dimension as contrasted to the exposed areas of the layer of photoresist material. Such a photoresist material is of the so-called negative type and may be based upon polyvinyl acetate, a commercial form of which is known as Horizon U-200 available from Horizons Research Incorporated of Cleveland, Ohio.

The advantages of the invention will be better understood from the following description when read in connection with the accompanying drawings in which.

Figure 2:
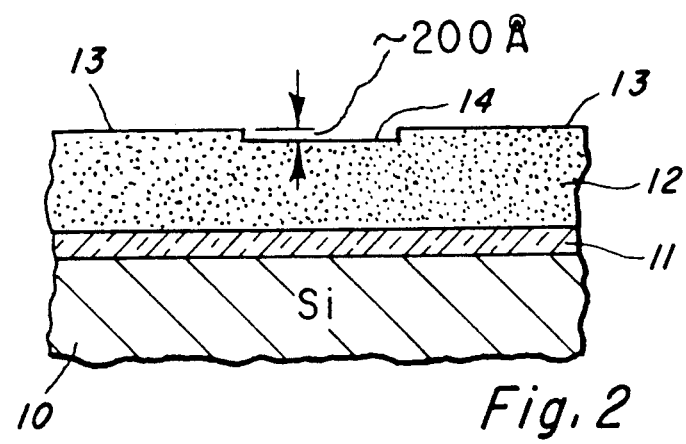
FIG. 2 is a cross-sectional view similar to FIG. 1, but showing a subsequent stage in the method following selective exposure of portions of the photoresist layer to an energy source, such as ultraviolet radiation, X-ray, or E-beam radiation, to impart a latent image therein.
Figure 3:
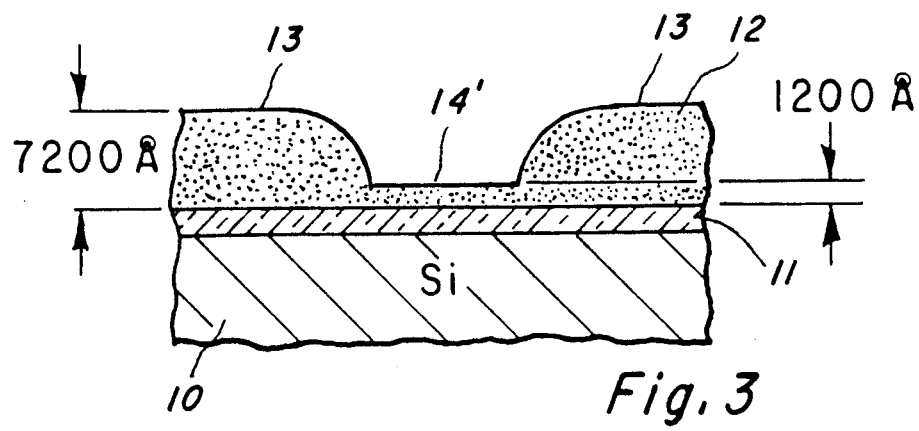
Figure 4:
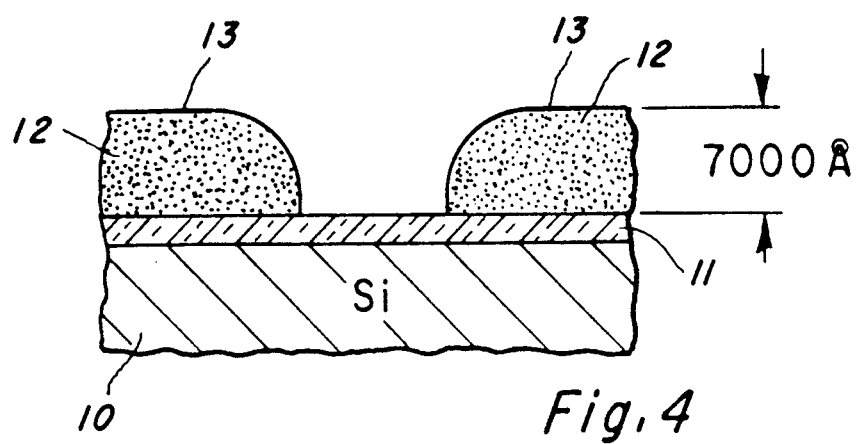

FIG. 3 is a cross-sectional view showing a stage in the method subsequent to that shown in FIG. 2 following application of a heat treatment to the photoresist layer; and FIG. 4 is a cross-sectional view showing the final stage in the method following complete development of the latent image in the photoresist layer by subjecting the photoresist layer to an oxygen-containing gaseous atmosphere in which monatomic oxygen and/or ozone are present as a reactive oxygen species.

DETAILED DESCRIPTION OF THE INVENTION

Figure 1:
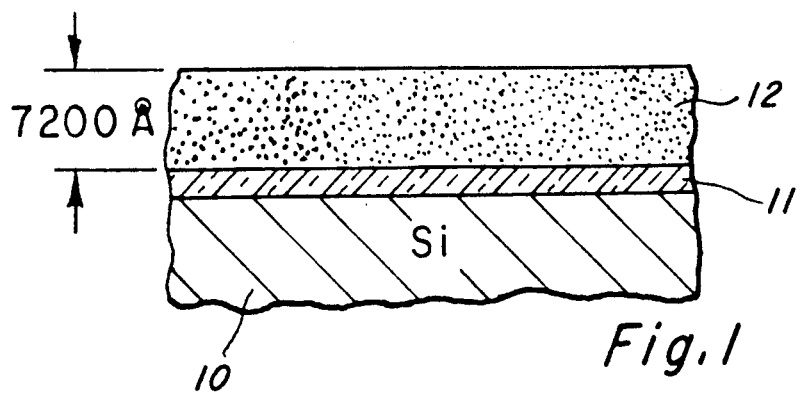
FIG. 1 is a cross-sectional view showing an initial stage in the method of dry developing a pattern in a photoresist layer as applied to a substrate in accordance with the present invention.

In accordance with this invention, a dry development method constituting an improvement of the method disclosed and claimed in pending U.S. patent application, Ser. No. 752,040 filed Dec. 20, 1976, now abandoned, referred to earlier, is disclosed, wherein portions of a photoresist layer are selectively removed from the surface of a substrate so as to produce a pattern in the layer of photoresist material for subsequent use in performing various treatments on the exposed regions of the substrate therebeneath. FIG. 1 illustrates a substrate 10 of semiconductor material such as silicon, for example, to which a layer 11 of insulation material has been applied. The insulation material of layer 11 may be silicon dioxide. A layer 12 of photoresist material is then applied to the insulation layer 11. It will be understood that the photoresist layer 12 may be applied directly to the surface of the substrate 10 in a given instance where it is desired to perform subsequent treatments, such as diffusion of dopant materials, or deposition of electrical contacts or other semiconductor components, for example, on selected surface portions of the substrate 10. In this respect, the desired pattern is originally imparted to the layer 12 of photoresist material by selectively exposing the layer 12 of photoresist material to an energy source, such as ultraviolet light, X-ray or E-beam radiation, to produce a photographically defined latent image of exposed regions 13 and unexposed regions 14 therein (FIG. 2).

In accordance with the present invention, the photoresist material which is employed must be of a type subject to a chemical or physical change upon undergoing exposure and/or another treatment thereto, wherein a selective thickness reduction of areas in the photoresist material conforming to the latent image imparted thereto can be achieved. In this context, the ability of a photoresist material to undergo a selective relative thickness reduction in areas comprising one of the exposed and unexposed areas of the photoresist material as contrasted to the other of such areas is critical to the present method.

By way of a specific example, the selective exposure of a layer of photoresist material to a suitable energy source in the manner previously described provides both exposed and non-exposed portions 13 and 14 in the photoresist material 12 defining the latent image imparted thereto (FIG. 2). It will be observed in FIG. 2 that the unexposed region 14 has acquired a slight thickness reduction with respect to the exposed regions 13, the thickness reduction of the unexposed region 14 resulting from partial volatilization thereof due to induced heat from the energy source over the entire surface of the layer of photoresist material. The exposed portions 13 are polymerized from direct exposure to the energy source and therefore become resistant to volatilization. Upon subjecting the selectively exposed photoresist material 12 to a heat treatment, the unexposed portion thereof undergoes partial volatilization so as to assume a reduced thickness 14' (FIG. 3) as contrasted to the exposed portions 13 of the photoresist material 12. One such photoresist material having the aforesaid properties is based upon polyvinyl acetate, known as Horizon U-200 and commercially avaialable from Horizons Research Incorporated of Cleveland, Ohio. Substantially similar photoresist materials based on polyvinyl acetate and available under the names "PHOTORIST" and "AQUARIST" from the said Horizons Research Incorporated are also suitable. A photoresist material of this character, wherein the dimensional thickness of selected portions thereof can be changed by processing prior to the development step effectively enhances the differential rate of reactivity existing between the exposed portions and non-exposed portions of the photoresist material as employed in a dry development process of the type disclosed in the aforesaid U.S. patent application, Ser. No. 752,040, filed Dec. 20, 1976, now abandoned. This difference in thickness across the layer of photoresist material depending upon whether the areas of the photoresist material are exposed or unexposed facilitates dry development in that the complete removal of the areas of photoresist material of reduced thickness down to the substrate surface is readily accomplished before degradation of the remaining portions of the photoresist material occurs to a degree damaging the pattern imparted thereto as illustrated in FIG. 4. Thus, it will be understood that the differential reaction rate as between the exposed and non-exposed areas of the photoresist material is significantly enhanced by treating the photoresist material prior to the development step in a manner causing a selective thickness reduction in the areas thereof depending upon whether such areas are exposed or non-exposed areas.

One type of photoresist material subject to this effect is polyvinyl alcohol (PVA) as activated with ammonium dichromate. A typical photoresist formulation can be made from a dry, bulk polyvinyl alcohol, such as that sold by Monsanto Corporation of St. Louis, Mo., under the name Gelvatol 20/30. Water solutions of PVA contain about 10% solid PVA. The activating chromate solution is generally ammonium dichromate and is usually prepared as a 10% water solution. An activated resist solution can be made by mixing 50 ml 10% PVA with 4 ml 10% ammonium dichromate. This photoresist material selectively undergoes a thickness reduction during the exposure thereof, wherein the areas unexposed to the energy source, such as ultraviolet radiation, partially volatize to assume a thickness of reduced magnitude. The photoresist may be prepared by dissolving polyvinyl alcohol in water to form a clear solution, following which trace quantities of a chromate solution, such as ammonium dichromate, are added to make the resulting solution photosensitive. Typically, such a photoresist is developed after the selective exposure thereof by applying water which redissolves the unexposed areas. However, in accordance with the present invention, the photoresist material is dry developed to produce the pattern therein as imparted by its selective exposure to a suitable energy source. To this end, the layer of photoresist material is exposed to a gaseous reactive oxygen species, as for example, an oxygen plasma (i.e. monatomic oxygen) maintained at $\frac{1}{2}$-1 torr $O_2$, RF 12.5 $MH_z$ plasma for 3-4 minutes. Although this is a useful embodiment of a photoresist material suitable for practicing the present dry development method, the unexposed areas of the photoresist material present some difficulty with respect to the completeness with which such areas may be cleared to developed out, since the gaseous reactive oxygen species to which the photoresist material is subjected tends to polymerize the otherwise unpolymerized photoresist.

A preferred photoresist material for use in practicing the method in accordance with this invention and of the type which selectively changes thickness dimensions during processing is the previously mentioned photoresist material Horizon U-200. This photoresist material appears to have a polyvinyl acetate base, thereby being chemically similar to polyvinyl alcohol (PVA). After being selectively exposed to a suitable energy source, this photoresist material undergoes a 40% to 60% thickness reduction in its non-exposed areas upon being subjected to a heat treatment maintained at a magnitude of approximately 90° C. for 1-2 minutes. It is believed that this selective thickness reduction occurs because components of the photoresist material in the unpolymerized areas (or non-exposed areas) are volatized by the heat treatment, whereas these components are chemically bound by the polymerization thereof in the selectively exposed areas. Thus, the heat activated thickness reduction occurs only in the unpolymerized areas or non-exposed areas of this photoresist material.

It will be understood that the family of photoresist materials capable of selective thickness reduction which may be suitable for use in practicing the method according to the present invention could be formed from several types of components. Where the photoresist material is of the negative type such that it would be rendered less soluble on exposure to a suitable energy source such as electromagnetic radiation, wherein such exposure would provide a negative or reverse pattern of the mask through which the electromagnetic radiation is directed, it is contemplated that the photoresist material composition may comprise monomers, which can be the same or different monomers, of a character forming cross-linkages upon exposure to the energy source so as to form a higher temperature stable polymer. In the unexposed areas, therefore, the monomer or monomers are unchanged or unpolymerized, and can be volatized by a moderate heat treatment. In a so-called positive photoresist material, the photoresist material becomes more soluble upon being exposed to electromagnetic radiation, thereby providing a positive image of the mask through which the radiation was directed. Thus, a positive photoresist material for use in the present method may comprise a composition of a material dissociated by light when exposed to a suitable energy source to form components of which either one or both may be volatized by applying a moderate heat treatment.

It is further contemplated that a photoresist material may be provided with a composition which is not included in the reaction involving the basic cross-linking or de-cross linking as brought about by the exposure of the photoresist material to a suitable energy source, but which serves to prevent a heat-activated thickness reduction of the photoresist material. This composition would be preferentially retained in either the exposed (cross-linked) or unexposed areas of the photoresist material upon subjection of the photoresist material to an appropriate heat treatment, thereby achieving selective removal of the composition and enabling the heat-activated thickness reduction of the areas of photoresist material from which such composition has been removed.

Thus, it will be understood that by selectively causing predetermined portions of the layer of photoresist material to undergo a chemical or physical change resulting in a reduction in thickness thereof, either by the application of a heat treatment to the layer of photoresist material or in other ways, the dry development differential reactivity is significantly enhanced, such that either the exposed or the unexposed areas of the photoresist material can be completely removed (depending upon whether the photoresist material is of a positive or negative type) before the other areas undergo sufficient degradation from the dry development procedure to damage the developing pattern. It will be further understood that a photoresist material having the property of increased selective thickness reduction when subjected to processing prior to the development thereof proportionately lessens the degree of dry development differential reactivity required as between the exposed and non-exposed areas of the photoresist material for producing the desired pattern.

In the dry development process of this invention, a layer of photoresist material having the selective thickness reduction characteristics herein described is applied to a substrate of different material, and thereafter selectively exposed to an energy source of a suitable type to produce a latent image therein. In one form of the invention, the selective exposure alone is sufficient to cause a thickness reduction of the photoresist material in one of the exposed and non-exposed areas thereof as contrasted to the other of the exposed and non-exposed areas. In such an instance, a separate heat treatment to achieve partial volatization of selected areas of the photoresist material with resulting selective thickness reduction may not be required. However, in a preferred embodiment of the invention, the substrate or slice as coated with the photoresist layer is heated and then contacted with a gaseous atmosphere including a gaseous reactive oxygen species adapted for differentially reacting the gaseous oxygen species with the exposed and unexposed regions of the layer of photoresist material.

By way of example, the gaseous reactive oxygen species may be provided by an oxygen plasma derived from a mixture of oxygen and argon, from which monatomic oxygen may be generated as a plasma species by the use of electrical fields or gaseous discharges at pressures below atmospheric pressure through known procedures. The layer of photoresist material having areas of reduced thickness as contrasted to other areas, wherein the reduced thickness areas can be either one of the exposed or non-exposed portions of the photoresist material, is exposed to the gaseous reactive plasma for differentially reacting the gaseous reactive plasma with the exposed and non-exposed regions of the photoresist material. Preferably, the areas of reduced thickness of the photoresist material are subject to a significantly greater etchant rate as contrasted to the etchant rate for the remaining areas of the layer of photoresist material such that the gaseous reactive plasma selectively attacks the areas of reduced thickness of the photoresist material for completely removing these areas of reduced thickness in a selective manner, with the remaining areas providing the desired pattern in the layer of photoresist material. In this manner, a dry development of the latent image in the photoresist layer is accomplished.

It will be understood that that latent image in the photoresist layer can be dry developed in accordance with the present method upon subjecting the photoresist layer having the areas of reduced thickness selectively disposed therein to a gaseous atmosphere which could be ozone or a mixture of monatomic oxygen and ozone, such as is disclosed in U.S. patent application, Ser. No. 752,040, filed Dec. 20, 1976, now abandoned. However, in the present instance, oxygen plasma containing monatomic oxygen is a preferred dry development source, since improved resolution of the pattern in the photoresist layer is attained by the use thereof. The oxygen plasma may be produced by employing an oxygen-argon mixture in a chamber between electrodes to which an RF generator is connected, wherein the RF generator operates at 13.5 MHz in a pressure range of from 0.5 torr to 1 torr with the chamber being maintained at a temperature in the approximate range of 150° to 250° C. at which dry development takes place.

For the purpose of describing specific examples of the heat-activated dry development process according to the present invention, reference is made to the following.

EXAMPLE 1

An oxidized silicon slice was coated with a layer of Horizon U-200, a photoresist material commercially available from Horizons Research Incorporated of Cleveland, Ohio. The initial thickness of the photoresist layer was 5,000 Å. The photoresist layer was then selectively exposed to ultraviolet radiation to impart a latent image thereto. The photoresist layer was heated to about 65° C. for 1-2 minutes causing a reduction in the thickness of the non-exposed areas thereof. The slice with the photoresist layer was placed in a reaction chamber and exposed to a gaseous atmosphere including ozone in a 2-3% concentration of an oxygen-containing gaseous atmosphere for 30 seconds at about 250° C. A developed pattern of the latent image of the photoresist layer of the order of 4,000 Å in thickness remained on the slice.

EXAMPLE 2

An oxidized silicon slice was coated with a layer of Horizon U-200 photoresist material. The photoresist layer was then selectively exposed to ultraviolet radiation for approximately 15 seconds to impart a latent image thereto. The photoresist layer was then heated to 90° C. for 3 minutes. The total thickness of the exposed area of the photoresist layer after the 3 minute heat treatment was 8763 Å, and the thickness of the non-exposed area of the photoresist layer was 5789 Å after the 3 minute heat treatment, leaving a thickness differential between the exposed and non-exposed areas of 2974 Å. The slice with the photoresist layer was then placed in a reaction chamber and exposed to an oxygen-containing gaseous atmosphere including oxygen plasma at a pressure of approximately 1 torr with the chamber being maintained at room temperature and the photoresist layer on the slice being subjected to the oxygen plasma atmosphere for a period of 1 minute. The slice was then removed, and the remaining photoresist layer thereon was measured. The total thickness of the remaining photoresist layer in the exposed area thereof was 8255 Å, whereas the thickness of the photoresist layer in the non-exposed area was 4445 Å. Thus, the differential thickness between the exposed and non-exposed areas of the photoresist layer following the oxygen plasma treatment was 3810 Å, thereby demonstrating a developed pattern of the latent image in the photoresist layer.

EXAMPLE 3

An oxidized silicon slice similar to that employed in Example 2 was coated with a layer of Horizon U-200 photoresist material. The photoresist layer was then selectively exposed to ultraviolet radiation for 15 seconds to impart a latent image thereto. The photoresist layer was then heated to 90° C. for 3 minutes. After this heat treatment, the photoresist layer had a total thickness of 8255 Å in the exposed area thereof and a total thickness of 5207 Å in the non-exposed area, thereby having a differential thickness of 3048 Å. After subjecting the slice with the photoresist layer to an oxygen-containing gaseous atmosphere including oxygen plasma in a reaction chamber at a pressure of approximately 1 torr and at room temperature over a period of 4 minutes, it was observed that the photoresist material had been entirely removed in the non-exposed area down to the level of the oxide layer on the silicon slice, while the total thickness of the photoresist layer in exposed areas thereof varied between 3302 Å at a central portion of the slice to 2286 Å at the peripheral edge thereof. Complete removal of the photoresist material in the non-exposed areas thereof provided a developed pattern of the latent image initially imparted to the photoresist layer by the selective exposure thereof to ultraviolet radiation.

Although preferred embodiments of the invention have been specifically described, it will be understood that the invention is to be limited only by the appended claims, since variations and modifications of the preferred embodiments will be apparent to those skilled in the art.

What is claimed is:

1. In the fabrication of an electronic structure, wherein a layer of photoresist material is disposed on a substrate surface of different material, a method of forming a dry developed pattern in said layer of photoresist material, said method comprising:

selecting a photoresist material of a character subject to a chemical or physical change rendering the photoresist material resistant to heat volatilization in response to the exposure of the photoresist material to an energy source, depositing a layer of said photoresist material on a substrate surface of different material, selectively exposing said layer of photoresist material to an energy source for providing exposed and unexposed regions on the photoresist material defining a latent image, subjecting the layer of photoresist material to a heat treatment, partially volatizing the unexposed regions of the photoresist material to provide regions of reduced thickness relative to the exposed regions of the photoresist material in response to the heat treatment, exposing said layer of photoresist material to a reactive gaseous atmosphere wherein the reactive character of the gaseous atmosphere is derived essentially from a gaseous reactive oxygen species of the group consisting of monatomic oxygen, ozone and mixtures thereof under conditions adapted for differentially reacting said gaseous reactive oxygen species with the exposed and unexposed regions of said layer of photoresist material, selectively removing photoresist material from said layer thereof at respectively different rates of removal with the unexposed regions of reduced thickness of said layer of photoresist material having the greater rate of removal from said layer by the differential reaction of the gaseous reactive oxygen species therewith, and discontinuing the selective removal of photoresist material from said layer thereof when only the regions of reduced thickness of said layer of photoresist material have been completely removed down to the substrate surface by ceasing exposure of said layer of photoresist material to the gaseous reactive oxygen species, thereby dry developing the latent image defined in the photoresist material to produce a pattern in said layer of photoresist material.

2. A method as set forth in claim 1, wherein the gaseous reactive oxygen species is an oxygen plasma derived from a mixture of oxygen and argon.

3. A method as set forth in claim 2, wherein the gaseous reactive oxygen plasma is an RF plasma.

4. A method as set forth in claim 1, wherein the gaseous reactive oxygen species is ozone.

5. A method as set forth in claim 1, wherein the photoresist material is a polyvinyl acetate composition.

6. A method as set forth in claim 1, wherein the energy source to which the layer of photoresist material is selectively exposed in producing the exposed and unexposed regions thereon is ultraviolet radiation.

7. A method as set forth in claim 1, wherein the heat treatment of the layer of photoresist material accompanies the selective exposure of said layer of photoresist material to the energy source.

8. A method as set forth in claim 1, wherein the heat treatment of the layer of photoresist material occurs after the selective exposure of said layer of photoresist material to the energy source.

9. A method as set forth in claim 1, wherein the photoresist material is a polyvinyl acetate composition, the energy source to which the layer of photoresist material is selectively exposed in producing the exposed and unexposed regions thereon is ultraviolet radiation, and the layer of photoresist material is heated to a temperature of approximately 65° C. by the heat treatment.

10. A method as set forth in claim 1, wherein the photoresist material is a polyvinyl acetate composition, the energy source to which the layer of photoresist material is selectively exposed in producing the exposed and unexposed regions thereon is ultraviolet radiation, and the layer of photoresist material is heated to a temperature of 90° C. by the heat treatment.

11. In the fabrication of an electronic structure, wherein a layer of photoresist material is disposed on a substrate surface of different material, a method of forming a dry developed pattern in said layer of photoresist material, said method comprising:
  selecting a photoresist material of a character subject to a chemical or physical change including a thickness reduction therein in response to the exposure of the photoresist material to an energy source,
  depositing a layer of said photoresist material on a substrate surface of different material,
  selectively exposing said layer of photoresist material to an energy source for providing exposed and unexposed regions on the photoresist material defining a latent image and in a manner causing the exposed regions of the photoresist material to assume a reduction in thickness as compared to the unexposed regions of the photoresist material,
  exposing said layer of photoresist material to a reactive gaseous atmosphere wherein the reactive character of the gaseous atmosphere is derived essentially from a gaseous reactive oxygen species of the group consisting of monatomic oxygen, ozone and mixtures thereof under conditions adapted for differentially reacting said gaseous reactive oxygen species with the exposed and unexposed regions of said layer of photoresist material,
  selectively removing photoresist material from said layer thereof at respectively different rates of removal with the exposed regions of reduced thickness of said layer of photoresist material having the greater rate of removal from said layer by the differential reaction of the gaseous reactive oxygen species therewith, and
  discontinuing the selective removal of photoresist material from said layer thereof when only the regions of reduced thickness of said layer of photoresist material have been completely removed down to the substrate surface by ceasing exposure of said layer of photoresist material to the gaseous reactive oxygen species, thereby dry developing the latent image defined in the photoresist material to produce a pattern in said layer of photoresist material.

12. A method as set forth in claim 11, wherein said photoresist material is polyvinyl alcohol activated by ammonium dichromate, and further including
  partially volatizing the regions of said photoresist material exposed to said energy source in achieving the reduction in thickness thereof.

13. A method as set forth in claim 12, wherein said photoresist material is derived from an aqueous mixture of 50 milliliters of 10% polyvinyl alcohol with 4 milliliters of 10% ammonium dichromate.

14. A method as set forth in claim 13, wherein the energy source to which the layer of photoresist material is selectively exposed in producing the exposed and unexposed regions thereon is ultraviolet radiation.

15. In the art of making a resist mask from a patterned resist coating on a substrate wherein said coating has exposed and non-exposed areas corresponding to the pattern for said mask in said coating, the improvement comprising:
  (a) the dry process step of subjecting said coating on said substrate to plasma action to preferentially remove the resist of one of said areas relative to the other area whereby said resist in said one area is removed faster than said resist in the other of said areas; and
  (b) terminating said plasma action when said resist of said one area is removed and said resist of said other area remains and is of a thickness to provide a resist mask function on said substrate.

16. In the art of making a resist mask as defined in claim 15, wherein said coating is a negative resist, and said plasma action removes the unexposed area of said negative resist more rapidly than the exposed area of said negative resist.

17. In the art of making a resist mask as defined in claim 15 wherein said coating is that of a negative resist and said one area of resist to be removed comprises an uncross-linked resist polymer.

18. In the art of making a resist mask as defined in claim 15, wherein said mask has an uncovered portion at said one area and a covered portion at said other area which are both for subsequent use of such mask, performing a process step through said uncovered portion of said mask and simultaneously limiting the performing of such process step at said covered portion, to thus provide a resist mask function on said substrate.

19. In the art of making a resist mask as defined in claim 18, wherein said substrate has material thereon immediately below said mask, and wherein said process step performed through said uncovered portion of such mask acts on said material.

20. In a resist development process for the making of a resist mask wherein a substrate having a resist coating thereon of substantially uniform thickness is subjected to radiation patterning to provide a first area and a second area in said resist coating, the improvement comprising:
  (a) the dry development of said patterned resist coating by subjecting said first and said second areas to dry plasma action which removes the resist coating in one of said areas more rapidly than in the other; and (b) terminating said plasma action when the removal of said resist coating in said one area is completed while the resist coating in the other of said areas is of a thickness to perform a resist mask function on said substrate.

21. In the resist development process as defined in claim 20, wherein said resist coated substrate is subjected to dry plasma action in a plasma generator chamber, and wherein said chamber is heated to a predetermined temperature, a predetermined pressure is produced within said chamber for said plasma action, and a predetermined radio frequency power is developed in said chamber for the dry plasma action to which said coating is subjected.

22. In the process as defined in claim 20, wherein said substrate is that for a semiconductor device and there is material below the resist coating, wherein said dry plasma action is accomplished in a plasma generator chamber, and wherein said one area from which the resist coating is removed is adapted to be subsequently used to treat therethrough the material below said resist coating.

23. In the process as defined in claim 22 wherein said material below said resist coating is silicon dioxide to be subsequently treated through said one area in said resist mask.

24. In the process as defined in claim 20, wherein said substrate is that for a semiconductor device and there is an insulation layer below the resist coating, and wherein said one area from which the resist coating is removed is adapted to be subsequently used to treat therethrough said insulation layer.

25. In the process as defined in claim 20, wherein said substrate is that for a semiconductor device and there is a layer below the resist coating, and wherein said one area from which the resist coating is removed is adapted to be subsequently used to treat therethrough said layer.

26. In the manufacture of an article with a substrate having a resist coating thereon for the purpose of making therefrom a resist mask with a first area and a second area on said substrate to perform a masking function, said manufacture including:

(a) the step of effecting a pattern in said resist coating corresponding to the desired configuration for said resist mask and including in said pattern said first and said second areas;

(b) subjecting said resist coating to plasma action to remove the resist in one of said areas more rapidly than the resist in the other area and provide said one area as a non-covered portion in said coating to accommodate a subsequent process step in said manufacture while said resist coating in said other area comprises a covered portion on said substrate to prevent any action by such subsequent process step at said covered portion; and (c) terminating said plasma action after said resist coating in said one of said areas is removed.

27. In the manufacture as defined in claim 26 wherein the article manufactured is a semiconductor device, said coating is a negative resist of a substantially uniform thickness, and said pattern-effecting step comprises exposing said resist to radiation whereby one of said areas is exposed and the other area is non-exposed, the step of subjecting said substrate and said exposed negative resist coating thereon to a bake before said plasma action, with said bake step effecting a reduction in the thickness of the coating at said unexposed area relative to the thickness of the coating at said exposed area.

28. In the manufacture of an article as defined in claim 26 wherein said substrate is that for a semiconductor device, and wherein said substrate with said patterned resist coating thereon is placed in plasma generator equipment and said plasma action is one of oxidation of said resist coating.

29. In the art of fabricating a resist mask for use in the manufacture of a semiconductor device having a semiconductor substrate with a layer of material thereon and a surface on said material, the process steps of:

(a) applying a resist coating of a substantially uniform thickness to said surface on said semiconductor substrate;

(b) baking said resist coating on said substrate to dry said coating;

(c) effecting a desired pattern in said resist coating by a source of radiation and with a first area and a second area in said pattern;

(d) relief baking said coating to produce a thickness difference in said coating such that the thickness of said coating in one of said areas is less than that in the other of said areas;

(e) loading said substrate into a plasma generator;

(f) operating said plasma generator and subjecting said patterned-resist coating to plasma action to develop said resist coating and in doing so to remove the resist of lesser thickness in said one area faster than said resist coating in the other area; and (g) terminating said plasma action at a time when said resist in said one area is completely removed, with said resist in said other area at said time being of a thickness to perform a masking function in a subsequent step in the manufacture of a semiconductor device.

30. In the art of fabricating a resist mask from a patterned resist coating on a substrate for use in the manufacture of a semiconductor device wherein exposed and nonexposed areas are created in said resist coating corresponding to the pattern therein for said mask, the improvement comprising:

(a) placing said substrate in a plasma generator chamber to perform a dry development process on said resist coating;

(b) heating in said generator chamber said substrate and the coating thereon to a predetermined temperature;

(c) adjusting pressure in said generator chamber to a predetermined amount;

(d) introducing a gas into said generator chamber at a predetermined pressure; and (e) applying radio frequency power in said generator chamber to produce plasma and to develop said coating with said plasma, said plasma acting to preferentially remove one of said areas of said coating while said other area of said coating is maintained at a thickness to serve as a resist mask on said substrate, and with said preferential removal accomplishing a faster removal of the resist coating in said one area than the removal thereof in said other area.

* * * * *